(12) United States Patent
Kim et al.

(10) Patent No.: US 10,627,665 B2
(45) Date of Patent: Apr. 21, 2020

(54) OPTICAL DISPLAY

(71) Applicant: Samsung SDI Co., Ltd., Yongin-si, Gyeonggi-do (KR)

(72) Inventors: Jin Woo Kim, Suwon-si (KR); Yoo Jin Kim, Suwon-si (KR); Dong Yoon Shin, Suwon-si (KR); Bae Wook Lee, Suwon-si (KR); Ji Hyun Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/205,118

(22) Filed: Nov. 29, 2018

(65) Prior Publication Data

US 2019/0196256 A1 Jun. 27, 2019

(30) Foreign Application Priority Data

Dec. 21, 2017 (KR) .................. 10-2017-0177600

(51) Int. Cl.
*H01L 33/62* (2010.01)
*G02F 1/1335* (2006.01)
(Continued)

(52) U.S. Cl.
CPC ...... *G02F 1/133512* (2013.01); *G02F 1/1339* (2013.01); *G02F 1/13452* (2013.01);
(Continued)

(58) Field of Classification Search
CPC ... H01L 33/483; H01L 33/62; G02F 2202/28; G02F 1/133512
See application file for complete search history.

(56) References Cited

U.S. PATENT DOCUMENTS

2016/0327828 A1* 11/2016 Asakawa .......... G02F 1/133345
2016/0363795 A1 12/2016 Jeon et al.
(Continued)

FOREIGN PATENT DOCUMENTS

CN 104345492 A 2/2015
KR 10-2009-0122092 A 11/2009
(Continued)

OTHER PUBLICATIONS

Taiwan Office action dated Sep. 18, 2019 from corresponding Taiwan Patent Application No. 107143214 (9 pgs.).
(Continued)

*Primary Examiner* — Dung A. Le
(74) *Attorney, Agent, or Firm* — Lewis Roca Rothgerber Christie LLP

(57) ABSTRACT

An optical display includes a display region and a non-display region. The optical display includes: an optical display element comprising a first substrate and a second substrate facing the first substrate, the second substrate having a metal interconnection layer thereon; and a first polarizing plate on an upper surface of the optical display element, wherein each of the first polarizing plate and the second substrate extends beyond the first substrate, the first polarizing plate includes a light shielding layer therein to conceal at least a portion of the metal interconnection layer, and the optical display further includes a securing member at a region surrounded by the first polarizing plate, the first substrate, and the second substrate.

24 Claims, 3 Drawing Sheets

(51) Int. Cl.
*G02F 1/1339* (2006.01)
*G02F 1/1345* (2006.01)
*H01L 33/48* (2010.01)

(52) U.S. Cl.
CPC .. *G02F 1/133514* (2013.01); *G02F 1/133528* (2013.01); *H01L 33/483* (2013.01); *G02F 2202/28* (2013.01); *H01L 33/62* (2013.01)

(56) References Cited

U.S. PATENT DOCUMENTS

| | | | |
|---|---|---|---|
| 2019/0278117 A1* | 9/2019 | Chung | G02F 1/13306 |
| 2019/0278143 A1* | 9/2019 | Sato | G02F 1/134363 |

FOREIGN PATENT DOCUMENTS

| | | | |
|---|---|---|---|
| KR | 10-2010-0001275 A | 1/2010 | |
| KR | 10-2012-0056519 A | 6/2012 | |
| KR | 10-2015-0015243 A | 2/2015 | |
| KR | 10-2016-0038559 A | 4/2016 | |
| KR | 10-2017-0086780 A | 7/2017 | |
| TW | M356139 U1 | 5/2009 | |

OTHER PUBLICATIONS

Korean Office Action dated Oct. 29, 2019 in corresponding Korean Patent Application No. 10-2017-0177600 (7 pgs.).

* cited by examiner

OPTICAL DISPLAY

CROSS-REFERENCE TO RELATED APPLICATION

This application claims priority to and the benefit of Korean Patent Application No. 10-2017-0177600, filed on Dec. 21, 2017, in the Korean Intellectual Property Office, the entire content of which is incorporated herein by reference.

BACKGROUND

1. Field

Embodiments of the present disclosure relate to an optical display.

2. Description of Related Art

An optical display includes a display region and a non-display region. The display region is light transmissive and is configured to display an image to be viewed through a screen. The non-display region is disposed along the periphery of the display region to surround the display region. The non-display region is an opaque region and is provided with a metal interconnection layer, a printed circuit board, a drive chip, and the like configured to display an image. Here, the printed circuit board, the drive chip, and the like are shielded so as not to be visible by a user of the optical display.

The optical display may include a color filter substrate having a color filter layer thereon and a thin film transistor (TFT) substrate having a metal interconnection layer thereon. The color filter substrate and the TFT substrate are configured to face each other. The TFT substrate may extend beyond the color filter substrate, such that the metal interconnection layer, the printed circuit board, and the like, are disposed on an extended portion of the TFT substrate. Generally, a rigid decorative frame is further on a polarizing plate on the color filter substrate to prevent the metal interconnection layer, the printed circuit board, and the like from being visible (or to reduce the visibility of the metal interconnection layer, the printed circuit board, and the like). However, such a decorative frame causes increase in thickness of the optical display. In addition, since the decorative frame is exposed separately of the screen of the optical display, the decorative frame can cause the optical display to have a poor appearance. One example of the background technique of the present disclosure invention is disclosed in Korean Patent Publication No. 2015-0015243, the entire content of which is incorporated herein by reference.

SUMMARY

An aspect of an embodiment of the present disclosure provides an optical display that can conceal a metal interconnection layer and the like without a decorative frame.

Another aspect of an embodiment of the present disclosure provides an optical display that includes a TFT substrate extending beyond a color filter substrate such that a metal interconnection layer and the like are disposed on an extended portion of the TFT substrate (e.g., on a portion of the TFT substrate that extends past the color filter substrate in a direction substantially parallel to the TFT substrate and color filter substrate), while concealing the metal interconnection layer and the like without a decorative frame.

Still another aspect of an embodiment of the present disclosure provides an optical display that does not include any decorative frame exposed outside of the optical display, thereby providing an optical display having a good appearance.

Still another aspect of an embodiment of the present disclosure provides an optical display that can prevent a polarizing plate and/or a light shielding layer from suffering from deformation (or can reduce a likelihood or degree of such deformation), such as wrinkling, due to shrinkage or expansion of a polarizer under high temperature and/or high temperature and high humidity conditions.

Still another aspect of an embodiment of the present disclosure provides an optical display that can minimize or reduce a difference in visibility between a display region and a non-display region.

In accordance with an embodiment of the present disclosure, there is provided an optical display including a display region and a non-display region. The optical display includes: an optical display element including a first substrate and a second substrate facing the first substrate, the second substrate having a metal interconnection layer thereon (e.g., formed thereon); and a first polarizing plate on an upper surface of the optical display element, wherein each of the first polarizing plate and the second substrate extends beyond the first substrate (e.g., extends past the first substrate in a direction substantially parallel to the first polarizing plate, the second substrate and the first substrate), the first polarizing plate includes a light shielding layer therein (e.g., formed therein) to conceal at least a portion of the metal interconnection layer, and the optical display further includes a securing member at (e.g., formed in) a region surrounded by the first polarizing plate, the first substrate, and the second substrate.

The securing member may contact only the first polarizing plate and at least a portion of the first substrate.

The securing member may contact only the first polarizing plate and at least a portion of the optical display element.

The securing member may contact the first polarizing plate, the first substrate, and the second substrate.

The securing member may completely fill the region surrounded by the first polarizing plate, the first substrate, and the second substrate.

The securing member may be include (e.g., formed of) an adhesive film and/or a sealing agent.

The sealing agent may include silica.

The first polarizing plate may include a main body facing the first substrate and an extended portion directly coupled to the main body and not facing the first substrate, and the light shielding layer may be in (e.g., formed in) the extended portion and a portion of the main body of the first polarizing plate.

The second substrate may include a main body facing the first substrate and an extended portion directly coupled to the main body and not facing the first substrate, and the metal interconnection layer may include a first metal interconnection layer on (e.g., formed on) the main body of the second substrate and a second metal interconnection layer on (e.g., formed on) the extended portion of the second substrate.

The light shielding layer may face the first metal interconnection layer and the second metal interconnection layer.

The second substrate may further include a dummy region between (e.g., formed between) the first metal interconnection layer and a pixel region of the display region.

The light shielding layer may face the first metal interconnection layer, the second metal interconnection layer, and a portion of the dummy region.

The light shielding layer may face the first metal interconnection layer, the second metal interconnection layer, and the dummy region.

The first polarizing plate may include: a polarizer; and a bonding layer and a first polarizer protective film sequentially stacked on one surface of the polarizer, and the light shielding layer may contact one surface of the first polarizer protective film and may be embedded in the bonding layer.

The light shielding layer may have a thickness of about 4 μm or less. The light shielding layer may include carbon black and/or a mixed pigment including a silver-tin alloy.

The light shielding layer may include a plurality of printed patterns separated from each other at an interface between the display region and the non-display region, wherein each of the plurality of printed patterns may include a single printed layer or multiple printed layers.

Each of the plurality of printed patterns may include a first printed layer and a second printed layer directly on (e.g., formed on) the first printed layer, and, when a point at which one first printed layer adjoins the interface between the display region and the non-display region is indicated by Point a, a point at which another first printed layer adjacent to the one first printed layer adjoins the interface between the display region and the non-display region is indicated by Point b, the closest vertex or inflection point of the one first printed layer to Point a is indicated by Point c, and the closest vertex or inflection point of the other first printed layer to Point a is indicated by Point d, a minimum value H among a distance from the interface between the display region and the non-display region to Point c and a distance from the interface between the display region and the non-display region to Point d may be about 200 μm or less.

Each of the plurality of printed patterns may include a first printed layer and a second printed layer directly on (e.g., formed on) the first printed layer, and, when a point at which the first printed layer adjoins the interface between the display region and the non-display region is indicated by Point a and a point of the second printed layer closest to the interface between the display region and the non-display region is indicated by Point a', the shortest distance ΔL between Point a and Point a' may be about 200 μm or less.

When a distance between Point a and Point b is W, the printed patterns may satisfy Relation 1: about 0.1× W≤H≤about 0.5×W.

The first printed layer may have a regular hexagonal shape and a shape of the second printed layer may be selected from at least one of rhombic, square, and amorphous shapes.

The optical display may further include: a color filter layer; and a black matrix layer, wherein the color filter layer and the black matrix layer may be on (e.g., formed on) a lower surface of the first substrate.

The black matrix layer may be separated from an outer peripheral surface of the color filter layer.

The optical display may further include: a second polarizing plate disposed on a lower surface of the optical display element.

The optical display element may include a liquid crystal panel including a liquid crystal layer or a light emitting diode substrate including a luminous material.

BRIEF DESCRIPTION OF DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
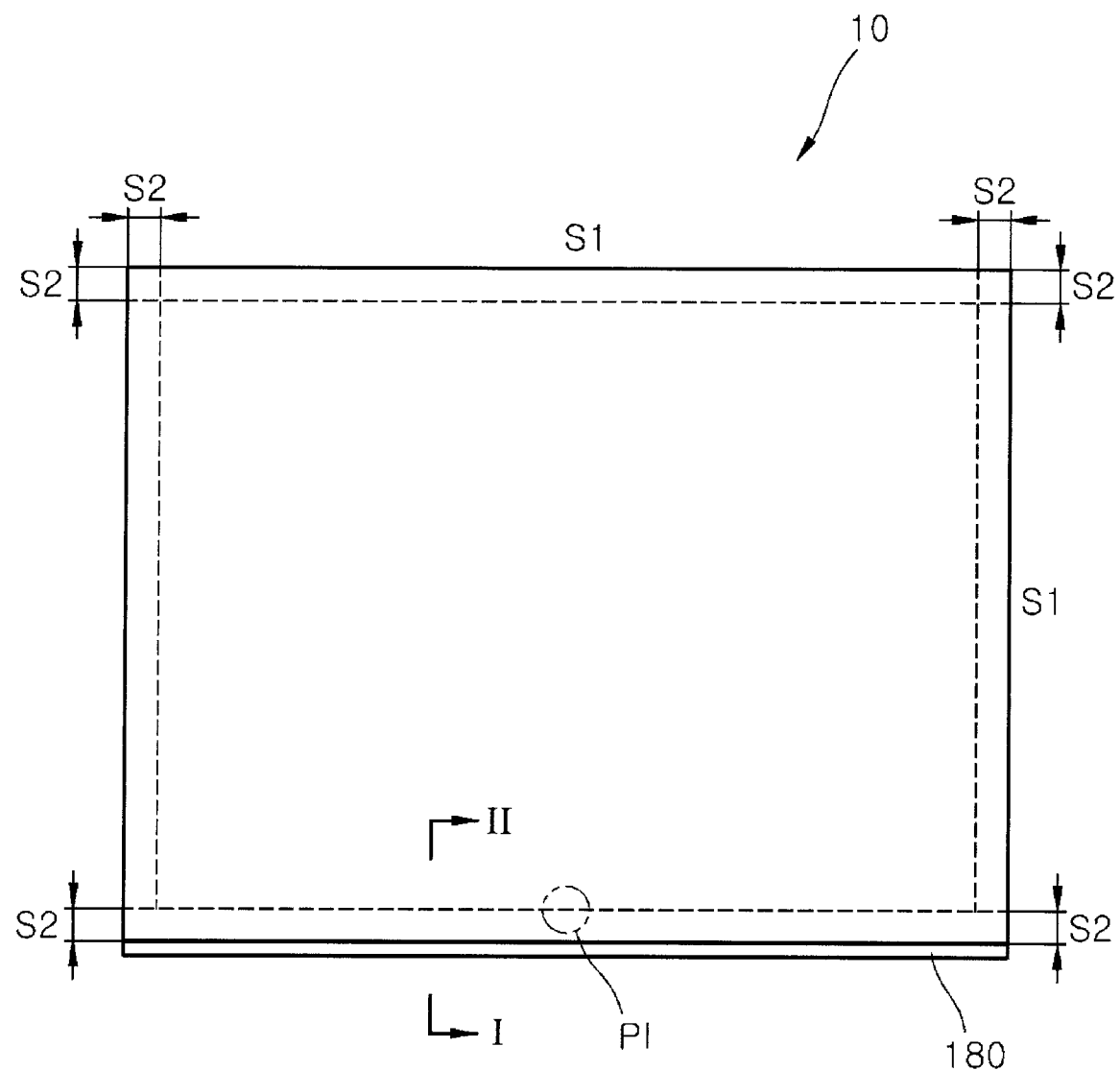
FIG. 1 is a plan view of an optical display according to one embodiment of the present disclosure.

Embodiments of the present disclosure will be described in more detail with reference to the accompanying drawings to provide a thorough understanding of the subject matter of the disclosure to those skilled in the art. It should be understood that the subject matter of the present disclosure may be embodied in different ways and is not limited to the following embodiments. In the drawings, portions irrelevant to the description will be omitted for clarity. Like components will be denoted by like reference numerals throughout the specification.

Herein, spatially relative terms such as "upper" and "lower" are defined with reference to the accompanying drawings. Thus, it will be understood that the term "upper surface" can be used interchangeably with the term "lower surface", and when an element such as a layer or a film is referred to as being "on" another element, it can be directly on the other element, or intervening element(s) may be present. On the other hand, when an element is referred to as being "directly on" another element, there are no intervening element(s) therebetween.

Figure 2:
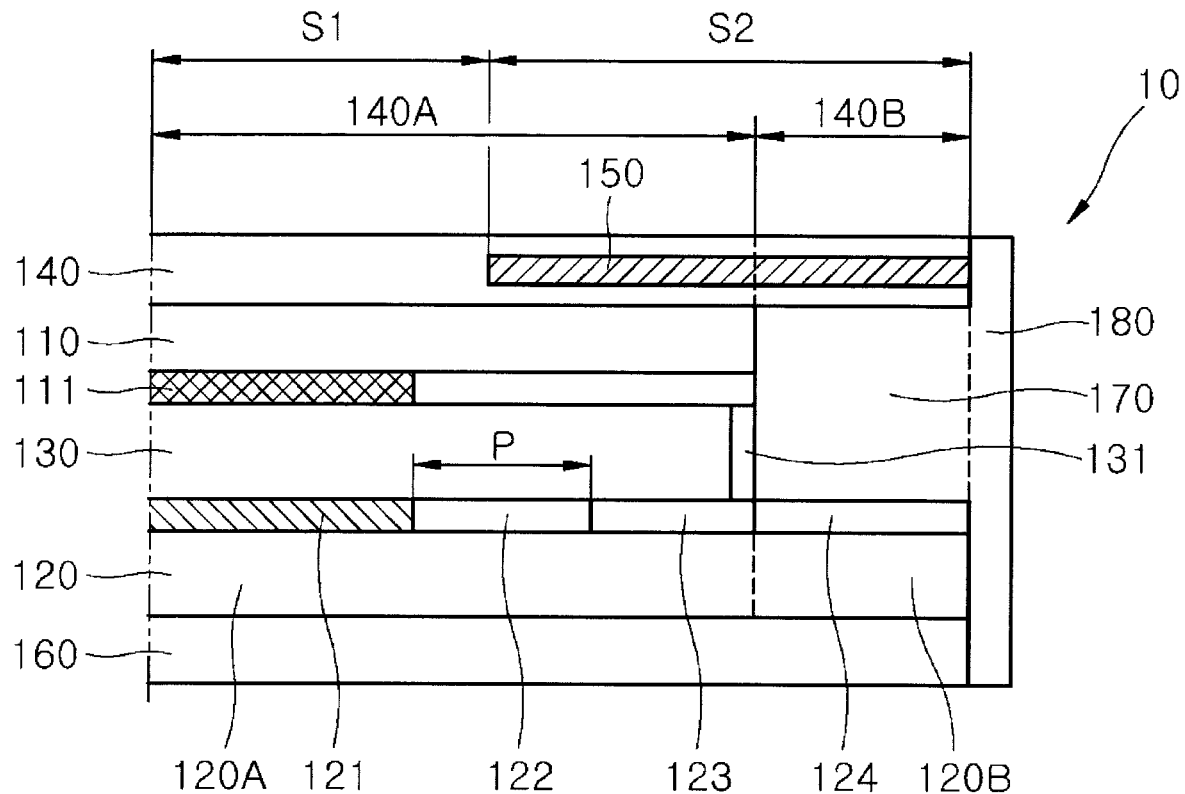
FIG. 2 is a partial cross-sectional view of the optical display of FIG. 1, taken along line I-II.

An optical display according to one embodiment of the present disclosure will be described with reference to FIG. 1 and FIG. 2. FIG. 1 is a plan view of an optical display according to one embodiment of the present disclosure. FIG. 2 is a partial cross-sectional view of the optical display of FIG. 1, taken along line I-II.

Referring to FIG. 1, the optical display 10 may include: a display region S1; and a non-display region S2 along (e.g., formed along a periphery of the display region S1. Although the non-display region S2 is shown as surrounding the entire periphery of the display region S1 in FIG. 1, it should be understood that the present disclosure is not limited thereto. In some embodiments, the non-display region may be located only at right and left sides of the display region, or may be located only at one selected from right, left, upper, and lower sides of the display region.

The optical display 10 has a frame 180 on (e.g., formed on) a side surface thereof, as viewed from the front. Referring to FIG. 2, the frame 180 directly contacts a first polarizing plate 140, a second substrate 120, and a second polarizing plate 160. Here, the respective contact portions may be integrally formed with one another. Accordingly, the frame 180 can support each of the first polarizing plate 140, the second substrate 120, and the second polarizing plate 160, thereby supporting the optical display including the display region and the non-display region. However, it should be understood that the present disclosure is not limited thereto and, for example, the frame may directly contact only the first polarizing plate and the second substrate. The frame may be formed of any suitable plastic material available in the art, without being limited thereto.

Although the frame is shown as being on (e.g., formed on) one surface of the optical display in FIG. 1, it should be understood that the present disclosure is not limited thereto and, for example, the optical display may have a frameless structure. In some embodiments, a support may be coupled to (e.g., connected to) the optical display via the side surface of the optical display, for example, the frame, to support the optical display.

Referring to FIG. 2, the optical display 10 may include a liquid crystal panel, the first polarizing plate 140 disposed on an upper surface of the liquid crystal panel, and the second polarizing plate 160 disposed on a lower surface of the liquid crystal panel. In one embodiment, the first polarizing plate 140 may be on (e.g., formed on) a light exit surface of the liquid crystal panel and the second polarizing plate 160 may be on (e.g., formed on) the light incident surface of the liquid crystal panel.

Although the optical display is shown as including the liquid crystal panel as an optical display element in FIG. 2, it should be understood that the present disclosure is not limited thereto. For example, the optical display may include a light emitting diode substrate containing a luminous material, as an optical display element.

The liquid crystal panel may include a first substrate 110, the second substrate 120 under (e.g., formed under) the first substrate 110 and facing the first substrate 110, and a liquid crystal layer 130 between (e.g., formed between) the first substrate 110 and the second substrate 120.

The liquid crystal layer 130 may include a liquid crystal that is uniformly oriented when an electric field is not applied thereto. For example, the liquid crystal layer may employ a vertical alignment (VA) mode, a patterned vertical alignment (PVA) mode, or a super-patterned vertical alignment (S-PVA) mode, without being limited thereto. The liquid crystal layer 130 may optionally further include a sealing layer 131 at both ends thereof to prevent the liquid crystal from flowing out or from being contaminated by external moisture (or to reduce a likelihood or amount of the liquid crystal flowing out or the likelihood or amount of contamination by external moisture). In addition, the liquid crystal layer may optionally further include a spacer to achieve a space allowing the liquid crystal layer to have a set (e.g., predetermined) thickness.

The first substrate 110 may be on (e.g., formed on) one surface of the liquid crystal layer 130 to support the liquid crystal layer 130.

In one embodiment, the first substrate 110 is a color filter substrate and may support a color filter layer 111 on (e.g., formed on) a lower surface of the first substrate 110. The color filter layer 111 may extract three light components of red (R), green (G), and blue (B) emitted from a plurality of pixels in (e.g., formed in) the display region S1 of the second substrate 120, thereby implementing the desired colors on the optical display. The color filter layer 111 may employ any suitable configuration generally used in the art. The color filter layer 111 may be in (e.g., formed in) at least a portion of the display region S1 of the optical display to extract light emitted from (or transmitted through) the liquid crystal layer 130. The color filter layer may be on (e.g., formed on) at least a portion of the lower surface of the first substrate. In one embodiment, the color filter layer 111 may be on (e.g., formed on) only a portion of the lower surface of the first substrate 110, as shown in FIG. 2. In another embodiment, the color filter layer may be on the entire (or substantially entire) lower surface of the first substrate.

The first substrate 110 may include an insulating material such as glass, polymers, or stainless steel. Any suitable glass, polymer, and/or stainless steel generally used in the art may be used as a material for the first substrate 110. The first substrate 110 may be flexible or may not be flexible.

In some embodiments, an electrode film for transmitting signals, such as an indium tin oxide (ITO) film, and an alignment film for aligning the liquid crystal in the liquid crystal layer may also be on (e.g., formed on) the lower surface of the first substrate 110.

The second substrate 120 may be on (e.g., formed on) the other surface of the liquid crystal layer 130 to support the liquid crystal layer 130.

In one embodiment, the second substrate 120 may be a TFT substrate. On a lower surface of the second substrate 120, a pixel region 121 having a plurality of TFTs arranged therein and a metal interconnection layer 123; 124 coupled to (e.g., connected to) the TFTs may be formed. A dummy region 122 may be between the pixel region 121 and the metal interconnection layer 123; 124.

The second substrate 120 extends beyond the first substrate 110. The second substrate 120 includes a main body 120A and an extended portion 120B directly coupled to (e.g., directly connected to) the main body 120A. The main body 120A may face the first substrate 110. The extended portion 120B does not face the first substrate 110.

The pixel region 121 on (e.g., formed on) the upper surface of the second substrate 120 includes the plurality of TFTs arranged therein and constitutes at least a portion of the display region. In some embodiments, the pixel region 121 constitutes or defines the display region S1.

The pixel region 121 may include a plurality of pixels R, G, B, gate lines coupled to (e.g., connected to) the plurality of pixels R, G, B, and data lines coupled to (e.g., connected to) the plurality of pixels R, G, B. The plurality of pixels R, G, B are located in the display region S1 of the pixel region 121 and may be arranged in a matrix in column and row directions. The plurality of pixels are respectively located at intersections of the gate lines and the data lines. Each pixel includes a TFT including a gate, an active layer, a source, and a drain. The gate lines are arranged at substantially regular intervals and each gate line extends along the row direction. The plurality of pixels R, G, B adjacent to one another in the row direction may be coupled to (e.g., connected to) the same gate line. The data lines are arranged at substantially regular intervals and each data line extends along the column direction. The plurality of pixels R, G, B may be respectively coupled to (e.g., connected to) the gate lines and the data lines through the TFTs. When a gate-on voltage is applied to the gate lines, the TFTs are turned on, such that data signals are respectively applied to the pixels through the data lines.

The dummy region 122 including dummy wires coupled (e.g., connected) between the gate lines and the data lines in the pixel region 121 may be adjacent to the pixel region 121. The dummy region 122 may optionally constitute a portion of the display region S1 and a portion of the non-display region S2. For example, a portion of the dummy region 122 may be in the display region S1 and another portion of the dummy region 122 may be in the non-display region S2.

The dummy region 122 is between the pixel region 121 and the metal interconnection layer 123; 124 and provides a buffer between various metal wires of the gate lines and data lines in the pixel region 121 and the metal interconnection layer. The dummy region 122 may have a width P of about 400 µm or less, for example, about 200 µm to about 400 µm. Within these ranges, the dummy region allows connection between the metal interconnection layer and the pixel region to be well established.

The metal interconnection layer 123; 124 may be adjacent to the dummy region 122. The metal interconnection layer 123; 124 includes a first metal interconnection layer 123 on (e.g., formed on) the main body 120A of the second substrate 120 and a second metal interconnection layer 124 on (e.g., formed on) the extended portion 120B of the second substrate 120. The first metal interconnection layer 123 and the second metal interconnection layer 124 are coupled to (e.g., connected to) each other and may each constitute or define the non-display region S2.

The first metal interconnection layer 123 is a layer in which various metal wires extending from the pixel region 121 and the dummy region 122 exist together, and may include a driving integrated circuit (driving IC). The second metal interconnection layer 124 may couple (e.g., connect) the first metal interconnection layer 123 to a printed circuit board (PCB). Here, connection between the first metal interconnection layer 123 and the PCB may be achieved by a chip-on-film (COF) process, a chip-on-glass (COG) process, a tape carrier package (TCP) process, and/or the like. The second metal interconnection layer 124 may be coupled to (e.g., connected to) the first metal interconnection layer 123 through an anisotropic conductive film (ACF), without being limited thereto.

In some embodiments, a bonding layer (for example, a sealing layer) may also be on (e.g., formed on) the upper surface of the second metal interconnection layer 124 to prevent the second metal interconnection layer 124 from being separated from the first metal interconnection layer 123 or the liquid crystal layer 130 (or to reduce a likelihood or degree of such separation).

An electrode film for transmitting signals, such as an indium tin oxide (ITO) film, and an alignment film for aligning the liquid crystal in the liquid crystal layer may also be on (e.g., formed on) the upper surface of the second substrate 120.

The second substrate 120 may include a material which is the same as or different from the material for the first substrate 110 as set forth above.

The first polarizing plate 140 may be on (e.g., formed on) one surface of the liquid crystal panel, for example, on the upper surface (the light exit surface) of the first substrate 110 to polarize light from the liquid crystal panel and emit or transmit the polarized light.

The first polarizing plate 140 may extend beyond the first substrate 110. The first polarizing plate 140 may include a main body 140A and an extended portion 140B directly coupled to (e.g., directly connected to) the main body 140A. The main body 140A may face the first substrate 110. The extended portion 140B does not face the first substrate 110. Instead, the extended portion 140B faces the extended portion 120B of the second substrate 120.

The first polarizing plate 140 includes a light shielding layer 150 therein (e.g., formed therein), wherein the light shielding layer 150 may constitute or define the non-display region S2. The light shielding layer 150 may be in (e.g., formed in) the extended portion 140B of the first polarizing plate 140 and a portion of the main body 140A of the first polarizing plate 140. For example, a portion of the light shielding layer 150 may be in the extended portion 140B of the first polarizing plate 140 and another portion of the light shielding layer 150 may be in the portion of the main body 140A of the first polarizing plate 140. Accordingly, the light shielding layer can prevent the metal interconnection layer from being visible (or can reduce the visibility of the metal interconnection layer to the outside of the optical display) or prevent the metal interconnection layer and at least a portion of the dummy region from being visible (or reduce the visibility of the metal interconnection layer and at least a portion of the dummy region to the outside of the optical display).

In one embodiment, the light shielding layer may be in (e.g., formed in) the first polarizing plate to face the metal interconnection layer (the first metal interconnection layer and the second metal interconnection layer) on the second substrate. Thus, the light shielding layer can prevent the metal interconnection layer on the second substrate from being visible (or can reduce the visibility of the metal interconnection layer to the outside of the display device).

In another embodiment, the light shielding layer may be in (e.g., formed in) the first polarizing plate to face the metal interconnection layer (the first metal interconnection layer and the second metal interconnection layer) and a portion of the dummy region on the second substrate, thereby preventing the metal interconnection layer and the portion of the dummy region on the second substrate from being visible (or reducing the visibility of the metal interconnection layer and the portion of the dummy region on the second substrate to the outside of the optical display).

In a further embodiment, the light shielding layer may be in (e.g., formed in) the first polarizing plate to face the metal interconnection layer (the first metal interconnection layer and the second metal interconnection layer) and the dummy region on the second substrate, thereby preventing the metal interconnection layer and the dummy region on the second substrate from being visible (or reducing the visibility of the metal interconnection layer and the portion of the dummy region on the second substrate to the outside of the optical display).

In this way, the metal interconnection layer is hidden by the light shielding layer 150, such that reflectance of the metal interconnection layer can be reduced, thereby improving visibility of the optical display.

Figure 3:
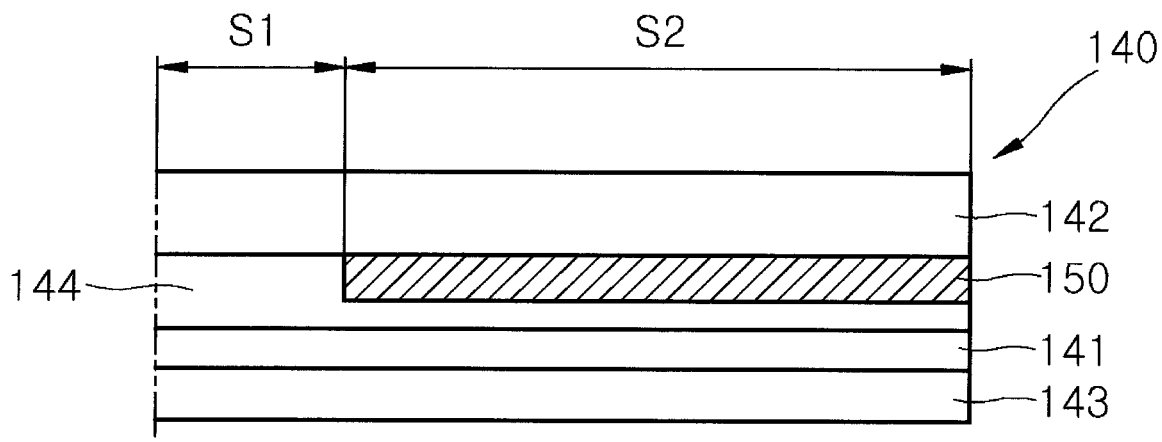
FIG. 3 is a partial cross-sectional view of a first polarizing plate according to one embodiment of the present disclosure.

FIG. 3 is a partial cross-sectional view of a first polarizing plate according to one embodiment of the present disclosure.

Referring to FIG. 3, the first polarizing plate 140 according to this embodiment may include: a polarizer 141; a bonding layer 144 and a first polarizer protective film 142 sequentially stacked on one surface of the polarizer 141; a second polarizer protective film 143 stacked on the other surface of the polarizer 141; and a light shielding layer 150 on (e.g., formed on) one surface of the first polarizer protective film 142 and embedded in the bonding layer 144. Since the light shielding layer 150 is embedded in the bonding layer 144, the overall thickness of the optical display can be reduced.

The light shielding layer 150 may be at an edge of the bonding layer 144 to surround at least a portion of the bonding layer 144. In one embodiment, the light shielding layer may be only at an edge of the bonding layer to have an open substantially rectangular shape.

The thickness of the light shielding layer 150 may be less than or equal to that of the bonding layer 144. In one embodiment, the thickness of the light shielding layer may be in a range of about 50% to about 100% that of the bonding layer. Within this range, the light shielding layer 150 can be embedded in the bonding layer, thereby reducing the overall thickness of the polarizing plate. For example, the light shielding layer may have a thickness of about 4 μm or less, for example, about 0.1 μm to about 4 μm, or about 1 μm to about 4 μm.

The light shielding layer 150 serves to block or absorb light and may include a set or specific design such as a logo of a company or a dot pattern. In other words, the light shielding layer may include a design providing aesthetic appeal to the optical display, thereby improving consumer preference.

The light shielding layer 150 may be formed from a composition for light shielding layers described herein below to have adhesion to the first polarizer protective film, thereby allowing the polarizer to be coupled to the first polarizer protective film. In this way, the polarizer can be coupled to the first polarizer protective film without a separate bonding layer between the polarizer and the light shielding layer and between the first polarizer protective film and the light shielding layer.

The composition for forming the light shielding layer may include a pigment, a binder resin, and an initiator and may further include at least one of a reactive unsaturated compound, a solvent, and an additive.

The pigment may include carbon black, a mixed pigment of silver-tin alloys (e.g., a mixed pigment including a silver-tin alloy), or a combination thereof. Examples of carbon black may include graphitized carbon, furnace black, acetylene black, and Ketjen black, without being limited thereto. The pigment may be used in the form of a pigment dispersion, without being limited thereto.

The binder resin may include an acrylic resin, a polyimide resin, a polyurethane resin, or a combination thereof. Examples of the acrylic resin may include a methacrylic acid/benzyl methacrylate copolymer, a methacrylic acid/benzyl methacrylate/styrene copolymer, a methacrylic acid/benzyl methacrylate/2-hydroxyethyl methacrylate copolymer, and a methacrylic acid/benzyl methacrylate/styrene/2-hydroxyethyl methacrylate copolymer. The polyurethane resin may be an aliphatic polyurethane resin. The acrylic resin may be an acrylic pressure-sensitive adhesive resin. However, it should be understood that the present disclosure is not limited thereto.

The reactive unsaturated compound has a lower weight average molecular weight than the binder resin and may include at least one of a photocurable unsaturated compound and a heat-curable unsaturated compound. Examples of the reactive unsaturated compound may include ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol tri(meth)acrylate, pentaerythritol tetra(meth)acrylate, dipentaerythritol penta(meth)acrylate, dipentaerythritol hexa(meth)acrylate, bisphenol A epoxy (meth)acrylate, ethylene glycol monomethyl ether (meth)acrylate, trimethylol propane tri(meth)acrylate, and tris(meth)acryloyloxyethyl phosphate, without being limited thereto.

The initiator may include at least one of a photopolymerization initiator and a heat-curing initiator. Examples of the photopolymerization initiator may include acetophenone compounds, benzophenone compounds, thioxanthone compounds, benzoin compounds, triazine compounds, and morpholine compounds, without being limited thereto. The heat-curing initiator may include at least one selected from the group consisting of: hydrazide compounds such as 1,3-bis(hydrazinocarbonoethyl-5-isopropylhydantoin); imidazole compounds such as 1-cyanoethyl-2-phenylimidazole, N-[2-(2-methyl-1-imidazolyl)ethyl]urea, 2,4-diamino-6-[2'-methylimidazolyl-(1')]-ethyl-s-triazine, N,N'-bis(2-methyl-1-imidazolylethyl)urea, N,N'-(2-methyl-1-imidazolylethyl)-adipamide, 2-phenyl-4-methyl-5-hydroxymethylimidazole, and 2-phenyl-4,5-dihydroxymethylimidazole; acid anhydride compounds such as tetrahydrophthalic anhydride, ethylene glycol-bis(anhydrotrimellitate); melamine compounds; guanidine compounds; dicyandiamide compounds; and modified aliphatic polyamine compounds.

Examples of the solvent may include: glycol ethers such as ethylene glycol methyl ether, ethylene glycol ethyl ether, and propylene glycol methyl ether; cellosolve acetates such as methyl cellosolve acetate, ethyl cellosolve acetate, and diethyl cellosolve acetate; carbitols such as methylethyl carbitol, diethyl carbitol, diethylene glycol monomethyl ether, diethylene glycol monoethyl ether, diethylene glycol dimethyl ether, diethylene glycol methylethyl ether, and diethylene glycol diethyl ether; and propylene glycol alkyl ether acetates such as propylene glycol methyl ether acetate and propylene glycol propyl ether acetate, without being limited thereto.

In one embodiment, the composition for forming the light shielding layer may include about 1 wt % to about 50 wt % of the pigment (or the pigment dispersion), about 0.5 wt % to about 20 wt % of the binder resin, about 0.1 wt % to about 10 wt % of the initiator, and the balance of the solvent. Within these ranges, the light shielding layer can have (e.g., be formed to have) a slim (e.g., thin) structure while achieving a good light shielding effect. In another embodiment, the composition for light shielding layers may include about 1 wt % to about 50 wt % of the pigment (or the pigment dispersion), about 0.5 wt % to about 20 wt % of the binder resin, about 0.1 wt % to about 20 wt % of the reactive unsaturated compound, about 0.1 wt % to about 10 wt % of the initiator, and the balance of the solvent. Within these ranges, the light shielding layer can have (e.g., be formed to have) a slim (e.g., thin) structure while achieving a good light shielding effect.

The composition for light shielding layers may further include about 0.1 wt % to about 1 wt % of other additives. For example, the additive may include a silane coupling agent, which serves to promote curing of the light shielding layer through UV irradiation.

Although the light shielding layer 150 is interposed between the first polarizer protective film 142 and the polarizer 141 in FIG. 3, it should be understood that the present disclosure is not limited thereto, and the light shielding layer 150 may be interposed between the second polarizer protective film 143 and the polarizer 141.

The polarizer 141, the first polarizer protective film 142, the second polarizer protective film 143, and the bonding layer 144 may include any suitable ones available in the art.

In one embodiment, the light shielding layer may include a printed pattern formed from the composition for light shielding layers. The light shielding layer may include a set or specific printed pattern at the interface between the display region and the non-display region to achieve high uniformity between the display region and the non-display region, thereby minimizing or reducing a visibility difference therebetween.

Figure 4:
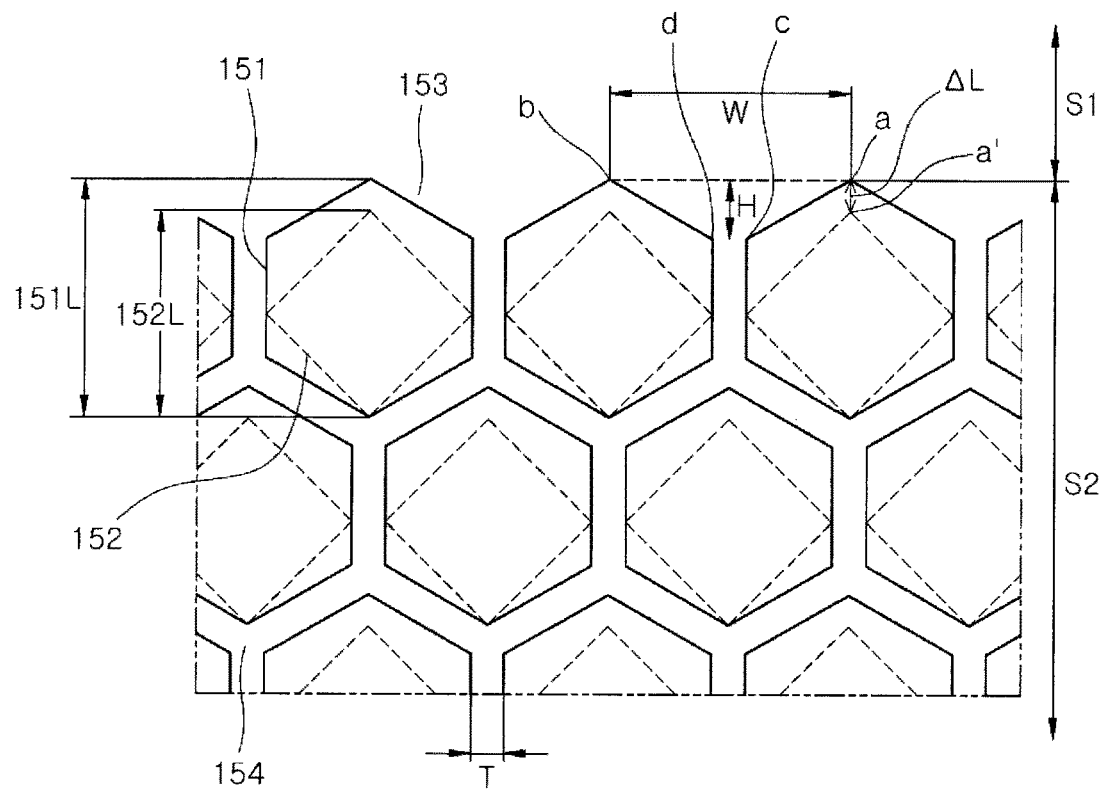
FIG. 4 is an enlarged cross-sectional view of a printed pattern at (e.g., formed at) the interface between a display region and a non-display region of a light shielding layer in region PI of the optical display of FIG. 1.

FIG. 4 is an enlarged view of a printed pattern formed at the interface between the display region and the non-display region of the light shielding layer in region PI of the optical display of FIG. 1. However, it should be understood that the printed pattern may be formed over the entire (or substantially entire) light shielding layer, including the interface between the display region and the non-display region of the light shielding layer.

Referring to FIG. 4, the light shielding layer may include a printed region composed of a plurality of printed patterns 153. The rest of the light shielding layer corresponds to a non-printed region 154. The printed patterns 153 are separated from one another.

Each of the printed patterns 153 includes: a first printed layer 151; and a second printed layer 152 directly formed on (or directly on) the first printed layer 151. The second printed layer 152 may have a different shape than the first printed layer 151 to provide the light shielding effect even when the light shielding layer is formed to have a slim (e.g., thin) structure. However, it should be understood that the present disclosure is not limited thereto and the second printed layer 152 may have the same (e.g., substantially the same) shape as the first printed layer 151.

In one embodiment, the second printed layers 152 may have a smaller unit area than the first printed layers 151.

In another embodiment, the number of the second printed layers 152 per unit area of the non-display region may be greater than that of the first printed layers 151.

A point at which one first printed layer 151 adjoins the interface between the display region S1 and the non-display region S2 is indicated by Point a, and a point at which another first printed layer 151 adjacent to the one first printed layer 151 adjoins the interface between the display region S1 and the non-display region S2 is indicated by Point b. The closest vertex or inflection point of the one first printed layer 151 to Point a is indicated by Point c, the closest vertex or inflection point of the other first printed layer 151 to Point b is indicated by Point d. A minimum value among the distance from the interface between the display region S1 and the non-display region S2 to Point c and the distance from the interface between the display region S1 and the non-display region S2 to Point d is indicated by H. In one embodiment, H may be about 200 μm or less, for example, about 0.1 μm to about 200 μm or about 5 μm to about 200 μm. Within these ranges of H, the light shielding layer can achieve the light shielding effect and uniformity between the display region and the non-display region can be improved to reduce a visibility difference therebetween while preventing the plurality of pixels R, G, B from being visible (or while reducing the visibility of the plurality of pixels R, G, B to the outside of the optical display).

As used herein, the term "interface between the display region and the non-display region" refers to an (imaginary) line connecting points of the first printed layers in (e.g., formed in) the non-display region, which are closest to the display region.

When a point at which the first printed layer 151 adjoins the interface between the display region S1 and the non-display region S2 is indicated by Point a and the closest point of the second printed layer 152 to the interface between the display region S1 and the non-display region S2 is indicated by Point a', the shortest distance ΔL between Point a and Point a' may be about 200 μm or less, for example, about 0.1 μm to about 200 μm or about 10 μm to about 200 μm. Within these ranges of ΔL, the light shielding layer can achieve the light shielding effect and uniformity between the display region and the non-display region can be improved to reduce a visibility difference therebetween.

A difference in length between a maximum major axis 151L of the first printed layer 151 and a maximum major axis 152L of the second printed layer 152 may be about 200 μm or less, for example, about 0.1 μm to about 200 μm or about 10 μm to about 200 μm. Within these ranges, the light shielding layer can achieve the light shielding effect and uniformity between the display region and the non-display region can be improved to reduce a visibility difference therebetween while preventing the plurality of pixels R, G, B from being visible (or reducing the visibility of the plurality of pixels R, G, B to the outside of the optical display).

The maximum major axis 151L of the first printed layer 151 may have a length of about 50 μm to about 600 μm, for example, about 100 μm to about 500 μm and the maximum major axis 152L of the second printed layer 152 may have a length of about 50 μm to about 500 μm, for example, about 50 μm to about 350 μm.

A point at which one first printed layer 151 adjoins the interface between the display region S1 and the non-display region S2 is indicated by Point a; a point at which another first printed layer 151 adjacent to the one first printed layer 151 adjoins the interface between the display region S1 and the non-display region S2 is indicated by Point b; and a distance from Point a to Point b is indicated by W. In some embodiments, W may range from about 10 μm to about 500 μm, for example, about 10 μm to about 490 μm or about 10 μm to about 480 μm. For example, W may be greater than H (W>H).

In one embodiment, the printed pattern may satisfy Relation 1: about $0.1 \times W \leq H \leq$ about $0.5 \times W$.

Relation 1 is set or designed to achieve uniformity at the interface between the display region and the non-display region in order to achieve uniformity of the first printed layer directly adjoining the interface between the display region and the non-display region.

Referring to FIG. 4, the first printed layer 151 may have a regular hexagonal shape and the second printed layer 152 may have a rhombic shape. However, it should be understood that the present disclosure is not limited thereto. For example, the first printed layer 151 may have an n-gonal shape (n being an integer of 3 to 10) such as a hexagonal shape (when n is 6), a circular shape, an elliptical shape, or an amorphous shape and the second printed layer 152 may have an n-gonal shape (n being an integer of 3 to 10) such as a hexagonal shape (when n is 6), a circular shape, an elliptical shape, or an amorphous shape.

Sides constituting the first printed layer 151 may have the same or different lengths. For example, each of the sides constituting the first printed layer 151 may have a length of about 10 μm to about 400 μm, for example, about 50 μm to about 300 μm. Sides constituting the second printed layer 152 may have the same or different lengths. For example, each of the sides constituting the second printed layer 151 may have a length of about 10 μm to about 400 μm, for example, about 50 μm to about 300 μm.

In one embodiment, the length of one side constituting the first printed layer 151 may be the same as or different from the length of one side constituting the second printed layer 152. In some embodiments, the length of one side constituting the first printed layer 151 is the same (e.g., substantially the same) as the length of one side constituting the second printed layer 152.

In one embodiment, the first printed layer may have a regular hexagonal shape and may be arranged in a honeycomb shape, and the second printed layer may have a rhombic, square, or amorphous shape.

The second printed layer may have a smaller area than the first printed layer. With this structure, the second printed layer can be on (e.g., formed on) the first printed layer. For example, the number of intersection points between the first printed layer and the second printed layer may be at least two, for example, three or more. As used herein, the term "intersection point" may refer to a point of intersection of the periphery of the first printed layer 151 and the periphery of the second printed layer 152, as shown in FIG. 4. When the number of the intersection points falls within these ranges, the light shielding layer can achieve high uniformity between the display region and the non-display region, thereby reducing a visibility difference therebetween while preventing R, G, B in the pixel from being visible (or thereby reducing the visibility of R, G, and B in the pixel to the outside of the optical display).

In one embodiment, the second printed layers 152 may have a smaller or larger unit area than the first printed layers 151.

In another embodiment, the number of the second printed layers 152 per unit area of the non-display region may be larger or smaller than that of the first printed layers 151.

A distance T between a pair of adjacent printed patterns 153 may range from about 1 µm to about 50 µm, for example, about 5 µm to about 30 µm. Within these ranges, the light shielding layer can exhibit light shielding properties without (or substantially without) adversely affecting uniformity between the display region and the non-display region.

The first printed layer 151 may have the same (e.g., substantially the same) thickness as or a different from that of the second printed layer 152. Each of the first printed layer 151 and the second printed layer 152 may have a thickness of about 4 µm or less, for example, about 0.1 µm to less than about 4 µm. Within these thickness ranges, the light shielding layer can be formed inside the bonding layer, thereby allowing a reduction in thickness of the polarizing plate while achieving light shielding properties, as compared to a polarizing plate that does not include a light shielding layer embedded therein.

In FIG. 4, the printed pattern is shown as having a bilayer structure of the first printed layer 151 and the second printed layer 152. However, it should be understood that the present disclosure is not limited thereto and the printed pattern may have a monolayer structure or a multilayer structure of, for example, three or more layers.

In FIG. 3 and FIG. 4, the first printed layer 151 is shown as a lowermost printed layer of the printed pattern, which directly contacts the first polarizer protective film 142. However, it should be understood that the present disclosure is not limited thereto and the first printed layer 151 may be formed between other printed layers without contacting the first polarizer protective film 142.

Referring to FIG. 2 again, the second polarizing plate 160 may be on (e.g., formed on) the other surface of the liquid crystal panel to polarize light from a light source and emit the polarized light to the liquid crystal panel. The second polarizing plate 160 may include a polarizer and a protective film on (e.g., formed on) at least one surface of the polarizer. Here, the polarizer and the protective film may include any suitable ones available in the art.

In some embodiments, the first polarizing plate 140 and the second polarizing plate 160 may be secured to the first substrate and the second substrate, respectively, using any suitable adhesive or bonding agent available in the art.

A securing member 170 may be in (e.g., formed in) a region surrounded by (e.g., defined by) the first polarizing plate 140, the first substrate 110, the liquid crystal layer 130, and the second substrate 120. The securing member 170 may contact the first polarizing plate 140, the first substrate 110, the liquid crystal layer 130, and the second substrate 120. For example, the securing member 170 contacts the extended portion 110B of the first substrate 110 and the extended portion 120B of the second substrate 120. In one embodiment, the securing member may completely (e.g., substantially completely) fill the region surrounded by the first polarizing plate, the first substrate, the liquid crystal layer, and the second substrate.

The securing member 170 serves to secure the first polarizing plate 140, for example, the extended portion 140B of the first polarizing plate 140, to the first substrate 110, the liquid crystal layer 130, and the second substrate 120 to allow the first polarizing plate to remain firmly secured when the first polarizing plate shrinks or expands due to shrinkage or expansion of the polarizer under high temperature and/or high temperature and high humidity conditions, thereby preventing the polarizing plate and the light shielding layer from suffering from deformation (or reducing a likelihood or degree of such deformation), such as wrinkling, while allowing the first polarizing plate, which extends beyond the first substrate, to retain the original shape thereof. If deformation occurs, the metal interconnection layer can be visible or display visibility of the optical display can be deteriorated. For example, the securing member prevents or reduces deformation of the light shielding layer due to shrinkage or expansion of the polarizer, thereby allowing the metal interconnection layer to be kept invisible (or thereby reducing the visibility of the metal interconnection layer to the outside of the optical display).

The securing member 170 may be formed by applying an adhesive film, such as an optically clear adhesive (OCA) or a pressure sensitive adhesive (PSA), to a set (e.g., predetermined) thickness, or by injecting a sealing agent into the region. The sealing agent may include a powder such as silica, without being limited thereto. For example, the silica may be SEAHOSTAR KE-S series (e.g., S100) produced by Nippon Shokubai Co., Ltd., without being limited thereto.

In FIG. 2, the securing member 170 is shown as contacting the first polarizing plate 140, the first substrate 110, the liquid crystal layer 130, and the second substrate 120. However, it should be understood that the present disclosure is not limited thereto and the securing member may contact only the first polarizing plate and at least a portion of the first substrate or may contact the first polarizing plate, the first substrate, and at least a portion of the liquid crystal layer, so long as the securing member can suppress or reduce deformation of the polarizing plate and the light shielding layer.

Next, an optical display according to another embodiment of the present disclosure will be described with reference to FIG. 5.

Figure 5:
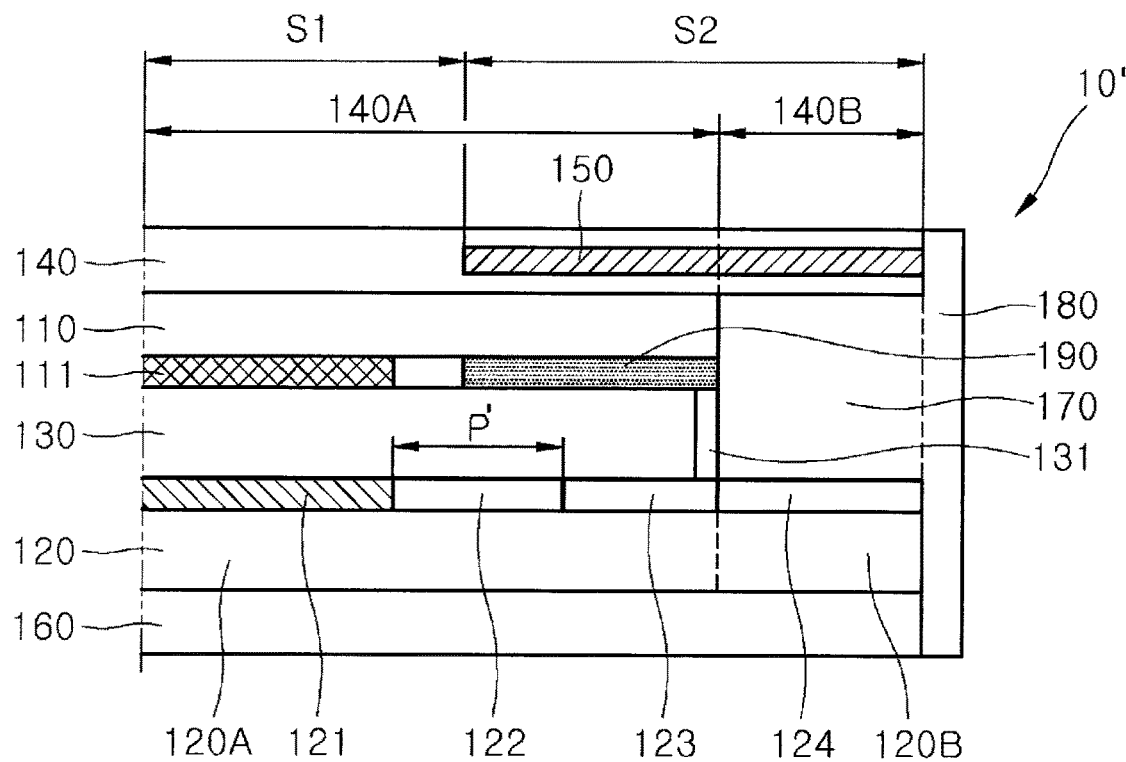
FIG. 5 is a partial cross-sectional view of an optical display according to another embodiment of the present disclosure.

Referring to FIG. 5, an optical display 10' according to this embodiment is substantially the same as the optical display 10 according to the above embodiment except that a black matrix layer 190 is further on (e.g., formed on) a lower surface of a first substrate 110.

On the lower surface of the first substrate 110, a color filter layer 111 and the black matrix layer 190 are located (e.g., formed). In one embodiment, the color filter layer 111 may be on (e.g., formed on) a portion of the lower surface of the first substrate 110 and the black matrix layer 190 may be separated from an outer peripheral surface of the color filter layer 111, without being limited thereto. The color filter layer 111 corresponds to (e.g., is formed to correspond to) the display region S1 and the black matrix layer 190 corresponds to (e.g., is formed to correspond to) the non-display region S2. The black matrix layer 190 serves to further prevent or reduce reflection on surfaces of the wires and prevent or reduce light leakage. The black matrix layer 190 may be formed from the composition for light shielding layers as set forth above or any suitable black matrix layer available in the art.

The present disclosure provides an optical display that can conceal a metal interconnection layer and the like without a decorative frame.

The present disclosure provides an optical display that includes a TFT substrate extending beyond a color filter substrate such that a metal interconnection layer is on the extended portion of the TFT substrate, while concealing the metal interconnection layer without a decorative frame.

The present disclosure provides an optical display free from any decorative frame exposed outside the optical display, thereby having good appearance.

Embodiments of the present disclosure provides an optical display which can prevent a polarizing plate and/or a light shielding layer from suffering from deformation (or reduce a likelihood or degree of such deformation), such as wrinkling, due to shrinkage or expansion of a polarizer under high temperature and/or high temperature and high humidity conditions.

Embodiments of the present disclosure provides an optical display which can minimize or reduce difference in visibility between a display region and a non-display region.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that various modifications, changes, alterations, and equivalent embodiments can be made by those skilled in the art without departing from the spirit and scope of the appended claims, and equivalents thereof.

What is claimed is:

1. An optical display comprising:
   an optical display element comprising a first substrate and a second substrate facing the first substrate, the second substrate having a metal interconnection layer thereon; and
   a first polarizing plate on an upper surface of the optical display element,
   wherein each of the first polarizing plate and the second substrate extends beyond the first substrate,
   the first polarizing plate comprises a light shielding layer therein to conceal at least a portion of the metal interconnection layer, and
   the optical display further comprises a securing member at a region defined by the first polarizing plate, the first substrate, and the second substrate, wherein the securing member comprises an adhesive film and/or a sealing agent.

2. The optical display according to claim 1, wherein the securing member contacts only the first polarizing plate and at least a portion of the first substrate.

3. The optical display according to claim 1, wherein the securing member contacts only the first polarizing plate and at least a portion of the optical display element.

4. The optical display according to claim 1, wherein the securing member contacts the first polarizing plate, the first substrate, and the second substrate.

5. The optical display according to claim 1, wherein the securing member completely fills the region defined by the first polarizing plate, the first substrate, and the second substrate.

6. The optical display according to claim 1, wherein the sealing agent comprises silica.

7. The optical display according to claim 1, wherein the first polarizing plate comprises a main body facing the first substrate and an extended portion directly coupled to the main body and not facing the first substrate, and the light shielding layer is in the extended portion and a portion of the main body of the first polarizing plate.

8. The optical display according to claim 1, wherein the second substrate comprises a main body facing the first substrate and an extended portion directly coupled to the main body and not facing the first substrate, and the metal interconnection layer comprises a first metal interconnection layer on the main body of the second substrate and a second metal interconnection layer on the extended portion of the second substrate.

9. The optical display according to claim 8, wherein the light shielding layer faces the first metal interconnection layer and the second metal interconnection layer.

10. The optical display according to claim 8, wherein the second substrate further comprises a dummy region between the first metal interconnection layer and a pixel region of a display region.

11. The optical display according to claim 10, wherein the light shielding layer faces the first metal interconnection layer, the second metal interconnection layer, and a portion of the dummy region.

12. The optical display according to claim 10, wherein the light shielding layer faces the first metal interconnection layer, the second metal interconnection layer, and the dummy region.

13. The optical display according to claim 1, wherein the first polarizing plate comprises:
a polarizer; and
a bonding layer and a first polarizer protective film sequentially stacked on one surface of the polarizer,
wherein the light shielding layer contacts one surface of the first polarizer protective film and is embedded in the bonding layer.

14. The optical display according to claim 13, wherein the light shielding layer has a thickness of about 4 μm or less.

15. The optical display according to claim 1, wherein the light shielding layer comprises carbon black and/or a mixed pigment comprising a silver-tin alloy.

16. The optical display according to claim 1, wherein the light shielding layer comprises a plurality of printed patterns separated from each other at an interface between a display region and a non-display region, each of the plurality of printed patterns comprising a single printed layer or multiple printed layers.

17. The optical display according to claim 16, wherein each of the plurality of printed patterns comprises a first printed layer and a second printed layer directly on the first printed layer,
the first printed layer of a first printed pattern comprises a first point at an interface between the display region and the non-display region,
the first printed layer of the first printed pattern comprises a second point at a vertex point of the first printed layer that is closest to the first point,
the first printed layer of a second printed pattern adjacent to the first printed pattern comprises a third point at the interface,
the first printed layer of the second printed pattern comprises a fourth point at a vertex of the first printed layer that is closest to the third point of the second printed pattern, and
a minimum value among a distance from the interface between the display region and the non-display region to the second point and a distance from the interface between the display region and the non-display region to the fourth point is about 200 μm or less.

18. The optical display according to claim 16, wherein each of the plurality of printed patterns comprises a first printed layer and a second printed layer directly on the first printed layer,
the first printed layer of a first printed pattern comprises a first point at an interface between the display region and the non-display region,
the second printed layer of the first printed pattern comprises a fifth point at a vertex of the second printed layer that is closest to the first point, and
the shortest distance ΔL between the first point and the fifth point is about 200 μm or less.

19. The optical display according to claim 17, wherein, when a distance between the first point and the third point is W, the printed patterns satisfy Relation 1: about 0.1×W≤H≤about 0.5×W.

20. The optical display according to claim 17, wherein the first printed layer has a regular hexagonal shape and a shape of the second printed layer is selected from at least one of rhombic, square, and amorphous shapes.

21. The optical display according to claim 1, further comprising:
a color filter layer; and
a black matrix layer,
the color filter layer and the black matrix layer being on a lower surface of the first substrate.

22. The optical display according to claim 21, wherein the black matrix layer is separated from an outer peripheral surface of the color filter layer.

23. The optical display according to claim 1, wherein the optical display element comprises a liquid crystal panel comprising a liquid crystal layer or a light emitting diode substrate comprising a luminous material.

24. The optical display according to claim 18, wherein the first printed layer has a regular hexagonal shape and a shape of the second printed layer is at least one of rhombic, square, and amorphous shapes.

* * * * *